(12) United States Patent
Li et al.

(10) Patent No.: US 10,808,526 B2
(45) Date of Patent: Oct. 20, 2020

(54) TRANSMITTER AND RECEIVER INTERFACE FOR DOWNHOLE LOGGING

(71) Applicant: Halliburton Energy Services, Inc., Houston, TX (US)

(72) Inventors: Peng Li, Houston, TX (US); Ziyang Li, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 16/579,796

(22) Filed: Sep. 23, 2019

(65) Prior Publication Data
US 2020/0116015 A1 Apr. 16, 2020

Related U.S. Application Data

(60) Provisional application No. 62/746,401, filed on Oct. 16, 2018.

(51) Int. Cl.
*E21B 47/14* (2006.01)
*H03G 3/30* (2006.01)
*H03G 5/00* (2006.01)

(52) U.S. Cl.
CPC ........... *E21B 47/14* (2013.01); *H03G 3/3078* (2013.01); *H03G 5/005* (2013.01)

(58) Field of Classification Search
None
See application file for complete search history.

(56) References Cited

U.S. PATENT DOCUMENTS 3,585,580 A * 6/1971 Vogel ...................... G01V 1/44
367/29
3,949,352 A * 4/1976 Vogel ...................... G01V 1/053
367/31

(Continued)

FOREIGN PATENT DOCUMENTS

CN 204789489 U 11/2015
CN 104624459 B 6/2017

OTHER PUBLICATIONS

International Search Report and Written Opinion for Application No. PCT/US2019/052962, dated Jan. 10, 2020.

(Continued)

*Primary Examiner* — Curtis J King
(74) *Attorney, Agent, or Firm* — John Wustenberg; C. Tumey Law Group PLLC

(57) ABSTRACT

A system may comprise a transmitter amplifier, a first isolation module, a first transducer, a first receiver, a second isolation module, a second transducer, wherein the second isolation module is connected to the second transducer, and a second receiver, wherein the second isolation module and the second transducer are connected to the second receiver. A method may comprise disposing a downhole tool into a wellbore, transmitting an excitation signal from the transmitter amplifier to the first transducer and the second transducer through the first isolation module and second isolation module, and creating a pressure pulse from the first transducer and the second transducer, sensing the echo with the first transducer and the second transducer, converting the echo into a received signal at the first transducer and the second transducer, and transmitting the received signal to the first receiver and the second receiver.

20 Claims, 6 Drawing Sheets

(56) References Cited

U.S. PATENT DOCUMENTS

| | | | | |
|---|---|---|---|---|
| 4,181,014 | A * | 1/1980 | Zuvela | E21B 47/001 340/853.5 |
| 4,248,087 | A * | 2/1981 | Dennis | G01F 23/2962 340/621 |
| 4,609,873 | A * | 9/1986 | Cox | G01V 3/28 324/338 |
| 4,635,061 | A * | 1/1987 | Lepere | G01S 13/526 342/195 |
| 5,121,265 | A * | 6/1992 | Hirose | G11B 5/02 360/64 |
| 5,568,448 | A * | 10/1996 | Tanigushi | B06B 1/08 175/40 |
| 5,640,371 | A * | 6/1997 | Schmidt | B06B 1/0633 367/153 |
| 5,724,308 | A * | 3/1998 | Sorrells | G01V 1/46 181/103 |
| 5,811,972 | A * | 9/1998 | Thompson | G01V 3/30 324/338 |
| 5,831,934 | A * | 11/1998 | Gill | G01V 1/48 367/25 |
| 5,869,968 | A * | 2/1999 | Brooks | G01V 3/30 324/338 |
| 6,124,713 | A | 9/2000 | Bornhofft et al. | |
| 6,218,842 | B1 * | 4/2001 | Bittar | G01V 3/30 324/339 |
| 6,359,438 | B1 * | 3/2002 | Bittar | G01V 3/28 324/369 |
| 9,043,153 | B2 * | 5/2015 | Denichou | G01V 3/18 702/7 |
| 2002/0153896 | A1 | 10/2002 | Yuratich et al. | |
| 2006/0062082 | A1 * | 3/2006 | Mandal | G01V 1/44 367/25 |
| 2007/0229082 | A1 * | 10/2007 | Vehra | G01V 3/30 324/339 |
| 2008/0094066 | A1 * | 4/2008 | Watts | G01V 3/12 324/337 |
| 2008/0258733 | A1 * | 10/2008 | Bittar | G01V 3/28 324/333 |
| 2010/0210962 | A1 * | 8/2010 | Xu | A61B 5/0816 600/529 |
| 2014/0350858 | A1 * | 11/2014 | Donderici | E21B 7/04 702/7 |
| 2015/0285939 | A1 * | 10/2015 | Donderici | E21B 47/113 324/324 |
| 2015/0301218 | A1 * | 10/2015 | Donderici | G01V 3/20 324/339 |
| 2016/0090835 | A1 * | 3/2016 | Sethi | G01V 3/18 324/338 |
| 2016/0109610 | A1 * | 4/2016 | Donderici | G01V 1/40 324/333 |
| 2016/0154133 | A1 * | 6/2016 | Donderici | G01V 1/50 367/12 |
| 2016/0168975 | A1 * | 6/2016 | Donderici | G01B 7/10 324/238 |
| 2016/0170068 | A1 * | 6/2016 | Donderici | G01V 13/00 324/339 |
| 2016/0195635 | A1 * | 7/2016 | Sethi | E21B 47/002 324/338 |
| 2016/0208602 | A1 * | 7/2016 | Donderici | G01V 3/38 |
| 2016/0208604 | A1 * | 7/2016 | Cao | E21B 47/16 |
| 2016/0282504 | A1 * | 9/2016 | Wilson | E21B 47/01 |
| 2017/0023620 | A1 | 1/2017 | Bondarenko et al. | |
| 2017/0115421 | A1 * | 4/2017 | Endo | G01V 1/303 |
| 2017/0160387 | A1 | 6/2017 | Chen et al. | |
| 2017/0211378 | A1 * | 7/2017 | Derkacz | E21B 47/13 |
| 2017/0362925 | A1 * | 12/2017 | Zhang | G01B 7/06 |
| 2018/0031413 | A1 * | 2/2018 | Stokely | E21B 47/00 |
| 2018/0283170 | A1 * | 10/2018 | Donderici | G01V 1/46 |
| 2020/0124758 | A1 * | 4/2020 | Li | G01V 1/305 |

OTHER PUBLICATIONS

Halliburton, Sperry Drilling, XBAT™ Plus Azimuthal Sonic and Ultrasonic LWD Service, H013097, May 2019.

Halliburton, Casing Integrity Monitoring for Mature Fields, H010381, Jul. 2013.

Halliburton, Xaminer Sonic Imager Service, H011818, Nov. 2018.

* cited by examiner

TRANSMITTER AND RECEIVER INTERFACE FOR DOWNHOLE LOGGING

BACKGROUND

Wellbores drilled into subterranean formations may enable recovery of desirable fluids (e.g., hydrocarbons) using any number of different techniques. Currently, drilling operations may identify subterranean formations through a bottom hole assembly if the subterranean formation is disposed horizontal to the bottom hole assembly. During operations, measurement operations may utilize a measurement assembly that may produce a pressure pulse, which may be recorded along with the echoes. Therefore, currently simultaneous excitation and sensing in a synchronous manner may be preferred in many types of logging tools where multiple actuators/sensors may be present. For example, accurate downhole caliper logging requires common excitation and then same time measurement from multiple ultrasonic transducers to limit tool motion impacts on the caliper measurement. A convenient and commonly used approach is to duplicate multiple transmitter/receiver channels and control them digitally to act at the same time. However, downhole tools usually have a lot of constraints on power and space, which requires simple, efficient hardware electronics design. Duplicating channels not only waste power and space downhole, there are also robustness issues when a lot of channels need to be controlled at the same time.

BRIEF DESCRIPTION OF THE DRAWINGS

These drawings illustrate certain aspects of some examples of the present disclosure and should not be used to limit or define the disclosure.

DETAILED DESCRIPTION

This disclosure may generally relate to a system and method for producing an excitation without saturating a receiver module and, more particularly, to a compact passive design that may allow multiple transducers to have common high voltage excitation path but with separate receiver paths without a digital system to intervene.

Figure 1:
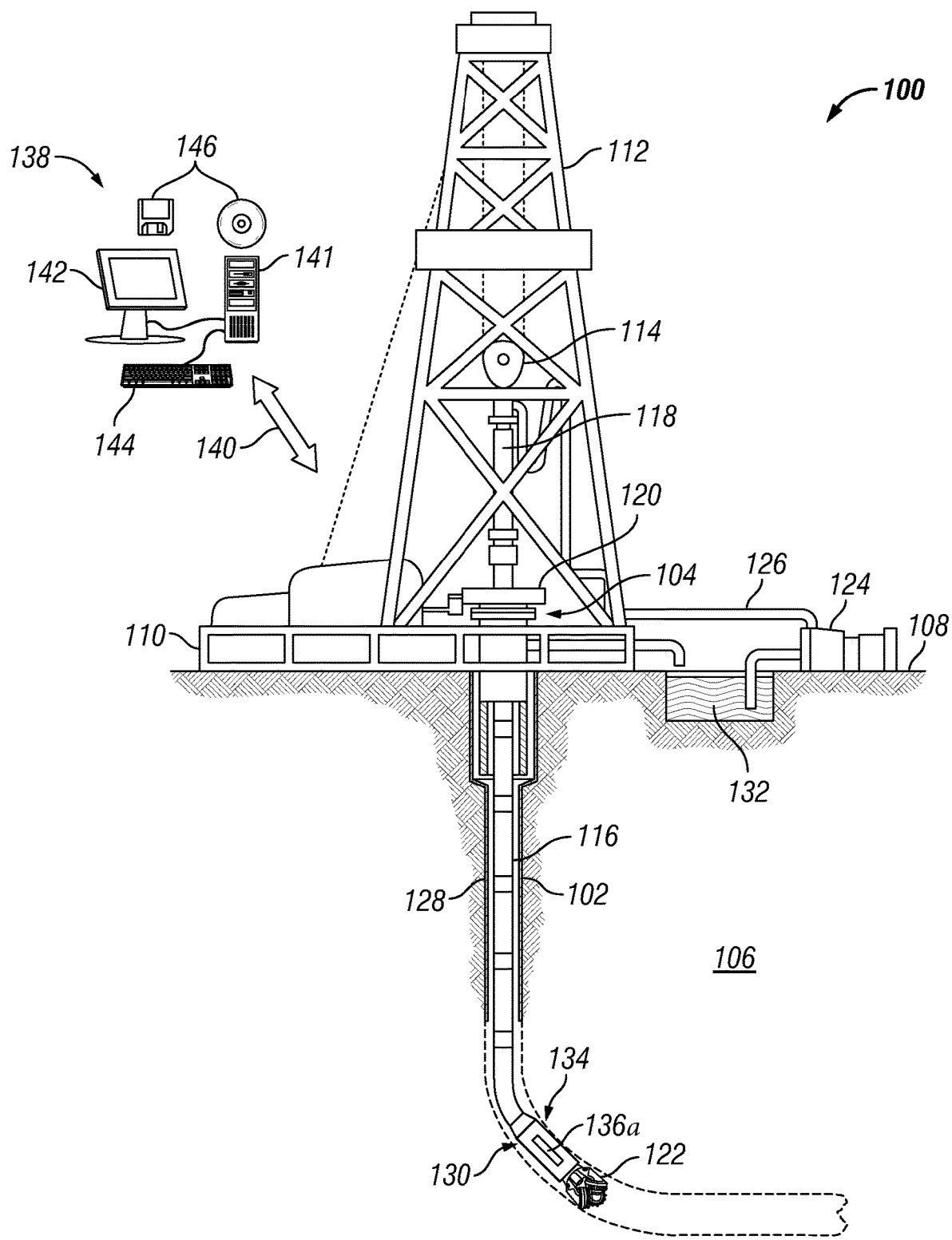
FIG. 1 illustrates an example of a drilling system.

FIG. 1 illustrates an example of drilling system 100. As illustrated, wellbore 102 may extend from a wellhead 104 into a subterranean formation 106 from a surface 108. Generally, wellbore 102 may include horizontal, vertical, slanted, curved, and other types of wellbore geometries and orientations. Wellbore 102 may be cased or uncased. In examples, wellbore 102 may include a metallic member. By way of example, the metallic member may be a casing, liner, tubing, or other elongated steel tubular disposed in wellbore 102.

As illustrated, wellbore 102 may extend through subterranean formation 106. As illustrated in FIG. 1, wellbore 102 may extend generally vertically into the subterranean formation 106, however, wellbore 102 may extend at an angle through subterranean formation 106, such as horizontal and slanted wellbores. For example, although FIG. 1 illustrates a vertical or low inclination angle well, high inclination angle or horizontal placement of the well and equipment may be possible. It should further be noted that while FIG. 1 generally depicts land-based operations, those skilled in the art may recognize that the principles described herein are equally applicable to subsea operations that employ floating or sea-based platforms and rigs, without departing from the scope of the disclosure.

As illustrated, a drilling platform 110 may support a derrick 112 having a traveling block 114 for raising and lowering drill string 116. Drill string 116 may include, but is not limited to, drill pipe and coiled tubing, as generally known to those skilled in the art. A kelly 118 may support drill string 116 as it may be lowered through a rotary table 120. A drill bit 122 may be attached to the distal end of drill string 116 and may be driven either by a downhole motor and/or via rotation of drill string 116 from surface 108. Without limitation, drill bit 122 may include, roller cone bits, PDC bits, natural diamond bits, any hole openers, reamers, coring bits, and the like. As drill bit 122 rotates, it may create and extend wellbore 102 that penetrates various subterranean formations 106. A pump 124 may circulate drilling fluid through a feed pipe 126 through kelly 118, downhole through interior of drill string 116, through orifices in drill bit 122, back to surface 108 via annulus 128 surrounding drill string 116, and into a retention pit 132.

With continued reference to FIG. 1, drill string 116 may begin at wellhead 104 and may traverse wellbore 102. Drill bit 122 may be attached to a distal end of drill string 116 and may be driven, for example, either by a downhole motor and/or via rotation of drill string 116 from surface 108. Drill bit 122 may be a part of bottom hole assembly 130 at the distal end of drill string 116. Bottom hole assembly 130 may further include tools for look-ahead resistivity applications. As will be appreciated by those of ordinary skill in the art, bottom hole assembly 130 may be a measurement-while drilling (MWD) or logging-while-drilling (LWD) system.

Bottom hole assembly 130 may comprise any number of tools, transmitters, and/or receivers to perform downhole measurement operations. For example, as illustrated in FIG. 1, bottom hole assembly 130 may include a measurement assembly 134. It should be noted that measurement assembly 134 may make up at least a part of bottom hole assembly 130. Without limitation, any number of different measurement assemblies, communication assemblies, battery assemblies, and/or the like may form bottom hole assembly 130 with measurement assembly 134. Additionally, measurement assembly 134 may form bottom hole assembly 130 itself. In examples, measurement assembly 134 may comprise at least one transducer 136a, which may be disposed at the surface of measurement assembly 134. It should be noted that while FIG. 1 illustrates a single transducer 136a, there may be any number of transducers disposed on measurement assembly 134. While illustrations may show transducers 136a-c, as seen below, references to transducer 136a apply to all transducers within the disclosure. Without limitation, transducers may be referred to as a transceiver. Without limitation, transducer 136a may also be disposed within measurement assembly 134 and there may be four other transducers that may be disposed ninety degrees from each other. However, it should be noted that there may be any number of transducers disposed along bottom hole assembly 130 at any degree from each other. Transducer 136a, and any other transducer, may function and operate to generate an acoustic pressure pulse that travels through borehole fluids. In examples, transducers 136a may further sense and acquire the reflected pressure wave which is modulated (i.e., reflected as an echo) by the borehole wall. During measurement operations, the travel time of the pulse wave from transmission to recording of the echo may be recorded. This information may lead to determining a radius of the borehole, which may be derived by the fluid sound speed. By analyzing the amplitude of the echo signal, the acoustic impedance may also be derived. Without limitation, transducers 136a may be made of piezo-ceramic crystals, or optionally magnetostrictive materials or other materials that generate an acoustic pulse when activated electrically or otherwise. In examples, transducers 136a may also include backing materials and matching layers. It should be noted that transducers 136a and assemblies housing transducers 136a may be removable and replaceable, for example, in the event of damage or failure.

Without limitation, bottom hole assembly 130 may be connected to and/or controlled by information handling system 138, which may be disposed on surface 108. Without limitation, information handling system 138 may be disposed down hole in bottom hole assembly 130. Processing of information recorded may occur down hole and/or on surface 108. Processing occurring downhole may be transmitted to surface 108 to be recorded, observed, and/or further analyzed. Additionally, information recorded on information handling system 138 that may be disposed down hole may be stored until bottom hole assembly 130 may be brought to surface 108. In examples, information handling system 138 may communicate with bottom hole assembly 130 through a communication line (not illustrated) disposed in (or on) drill string 116. In examples, wireless communication may be used to transmit information back and forth between information handling system 138 and bottom hole assembly 130. Information handling system 138 may transmit information to bottom hole assembly 130 and may receive as well as process information recorded by bottom hole assembly 130. In examples, a downhole information handling system (not illustrated) may include, without limitation, a microprocessor or other suitable circuitry, for estimating, receiving and processing signals from bottom hole assembly 130. Downhole information handling system (not illustrated) may further include additional components, such as memory, input/output devices, interfaces, and the like. In examples, while not illustrated, bottom hole assembly 130 may include one or more additional components, such as analog-to-digital converter, filter, and amplifier, among others, that may be used to process the measurements of bottom hole assembly 130 before they may be transmitted to surface 108. Alternatively, raw measurements from bottom hole assembly 130 may be transmitted to surface 108.

Any suitable technique may be used for transmitting signals from bottom hole assembly 130 to surface 108, including, but not limited to, wired pipe telemetry, mud-pulse telemetry, acoustic telemetry, and electromagnetic telemetry. While not illustrated, bottom hole assembly 130 may include a telemetry subassembly that may transmit telemetry data to surface 108. At surface 108, pressure transducers (not shown) may convert the pressure signal into electrical signals for a digitizer (not illustrated). The digitizer may supply a digital form of the telemetry signals to information handling system 138 via a communication link 140, which may be a wired or wireless link. The telemetry data may be analyzed and processed by information handling system 138.

As illustrated, communication link 140 (which may be wired or wireless, for example) may be provided that may transmit data from bottom hole assembly 130 to an information handling system 138 at surface 108. Information handling system 138 may include a personal computer 141, a video display 142, a keyboard 144 (i.e., other input devices), and/or non-transitory computer-readable media 146 (e.g., optical disks, magnetic disks) that can store code representative of the methods described herein. In addition to, or in place of processing at surface 108, processing may occur downhole.

As discussed below, methods may be utilized by information handling system 138 to determine properties of subterranean formation 106. Information may be utilized to produce an image, which may be generated into, one, two or three-dimensional models of subterranean formation 106. These models may be used for well planning, (e.g., to design a desired path of wellbore 102). Additionally, they may be used for planning the placement of drilling systems within a prescribed area. This may allow for the most efficient drilling operations to reach a subsurface structure. During drilling operations, measurements taken within wellbore 102 may be used to adjust the geometry of wellbore 102 in real-time to reach a geological target. Measurements collected from bottom hole assembly 130 of the formation properties may be used to steer drilling system 100 toward a subterranean formation 106. Optionally, these measurements may be used to plan well completion operations, including but not limited to placement of packers, hydraulic fracturing, cementing, acidizing or the placement of mud-loss mitigation treatments. Optionally, these measurements may be used for reservoir or over-burden characterization purposes.

Figure 2:
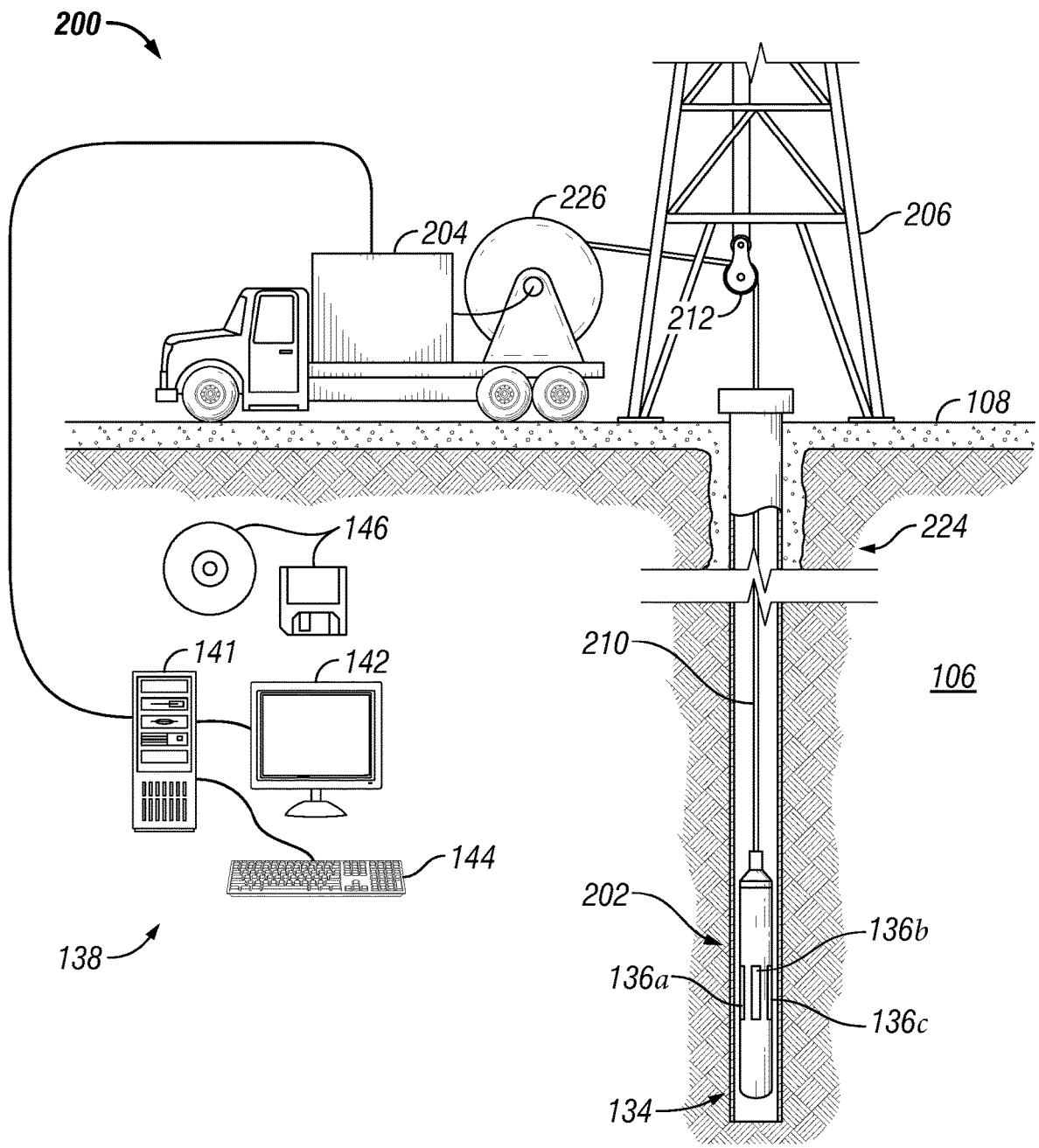
FIG. 2 illustrates an example of a well measurement system.

FIG. 2 illustrates a cross-sectional view of an example of well measurement system 200. As illustrated, well measurement system 200 may comprise downhole tool 202 attached a vehicle 204. In examples, it should be noted that downhole tool 202 may not be attached to a vehicle 204. Downhole tool 202 may be supported by rig 206 at surface 108. Downhole tool 202 may be tethered to vehicle 204 through conveyance 210. Conveyance 210 may be disposed around one or more sheave wheels 212 to vehicle 204. Conveyance 210 may include any suitable means for providing mechanical conveyance for downhole tool 202, including, but not limited to, wireline, slickline, coiled tubing, pipe, drill pipe, downhole tractor, or the like. In some embodiments, conveyance 210 may provide mechanical suspension, as well as electrical and/or optical connectivity, for downhole tool 202. Conveyance 210 may comprise, in some instances, a plurality of electrical conductors and/or a plurality of optical conductors extending from vehicle 204, which may provide power and telemetry. In examples, an optical conductor may utilize a battery and/or a photo conductor to harvest optical power transmitted from surface 108. Conveyance 210 may comprise an inner core of seven electrical conductors covered by an insulating wrap. An inner and outer steel armor sheath may be wrapped in a helix in opposite directions around the conductors. The electrical and/or optical conductors may be used for communicating power and telemetry between vehicle 204 and downhole tool 202. Information from downhole tool 202 may be gathered and/or processed by information handling system 138. For example, signals recorded by downhole tool 202 may be stored in memory and then processed by downhole tool 202. The processing may be performed real-time during data acquisition or after recovery of downhole tool 202. Processing may alternatively occur downhole or may occur both downhole and at surface. In some embodiments, signals recorded by downhole tool 202 may be conducted to information handling system 138 by way of conveyance 210. Information handling system 138 may process the signals, and the information contained therein may be displayed for an operator to observe and stored for future processing and reference. Information handling system 138 may also contain an apparatus for supplying control signals and power to downhole tool 202.

Systems and methods of the present disclosure may be implemented, at least in part, with information handling system 138. While shown at surface 108, information handling system 138 may also be located at another location, such as remote from borehole 224. Information handling system 138 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, an information handling system 138 may be a personal computer 141, a network storage device, or any other suitable device and may vary in size, shape, performance, functionality, and price. Information handling system 138 may include random access memory (RAM), one or more processing resources such as a central processing unit (CPU) or hardware or software control logic, ROM, and/or other types of nonvolatile memory. Additional components of the information handling system 138 may include one or more disk drives, one or more network ports for communication with external devices as well as various input and output (I/O) devices, such as a keyboard 144, a mouse, and a video display 142. Information handling system 138 may also include one or more buses operable to transmit communications between the various hardware components. Furthermore, video display 142 may provide an image to a user based on activities performed by personal computer 141. For example, producing images of geological structures created from recorded signals. By way of example, a video display unit may produce a plot of depth versus the two cross-axial components of the gravitational field and versus the axial component in borehole coordinates. The same plot may be produced in coordinates fixed to the Earth, such as coordinates directed to the North, East and directly downhole (Vertical) from the point of entry to the borehole. A plot of overall (average) density versus depth in borehole or vertical coordinates may also be provided. A plot of density versus distance and direction from the borehole versus vertical depth may be provided. It should be understood that many other types of plots are possible when the actual position of the measurement point in North, East and Vertical coordinates is taken into account. Additionally, hard copies of the plots may be produced in paper logs for further use.

Alternatively, systems and methods of the present disclosure may be implemented, at least in part, with non-transitory computer-readable media 146. Non-transitory computer-readable media 146 may include any instrumentality or aggregation of instrumentalities that may retain data and/or instructions for a period of time. Non-transitory computer-readable media 146 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

In examples, rig 206 includes a load cell (not shown) which may determine the amount of pull on conveyance 210 at the surface of borehole 224. Information handling system 138 may comprise a safety valve (not illustrated) which controls the hydraulic pressure that drives drum 226 on vehicle 204 which may reel up and/or release conveyance 210 which may move downhole tool 202 up and/or down borehole 224. The safety valve may be adjusted to a pressure such that drum 226 may only impart a small amount of tension to conveyance 210 over and above the tension necessary to retrieve conveyance 210 and/or downhole tool 202 from borehole 224. The safety valve is typically set a few hundred pounds above the amount of desired safe pull on conveyance 210 such that once that limit is exceeded, further pull on conveyance 210 may be prevented.

As illustrated in FIG. 2, downhole tool 202 may include measurement assembly 134. It should be noted that measurement assembly 134 may make up at least a part of downhole tool 202. Without limitation, any number of different measurement assemblies, communication assemblies, battery assemblies, and/or the like may form downhole tool 202 with measurement assembly 134. Additionally, measurement assembly 134 may form downhole tool 202 itself. In examples, measurement assembly 134 may comprise at least one transducer 136a, which may be disposed at the surface of measurement assembly 134. As illustrated, transducers 136a-c may also be disposed within measurement assembly 134. Without limitation, there may be four transducers that may be disposed ninety degrees from each other. However, it should be noted that there may be any number of transducers disposed along bottom hole assembly 130 at any degree from each other. Transducers may function and operate to generate and receive acoustic pulses in the borehole fluid.

Figure 3:
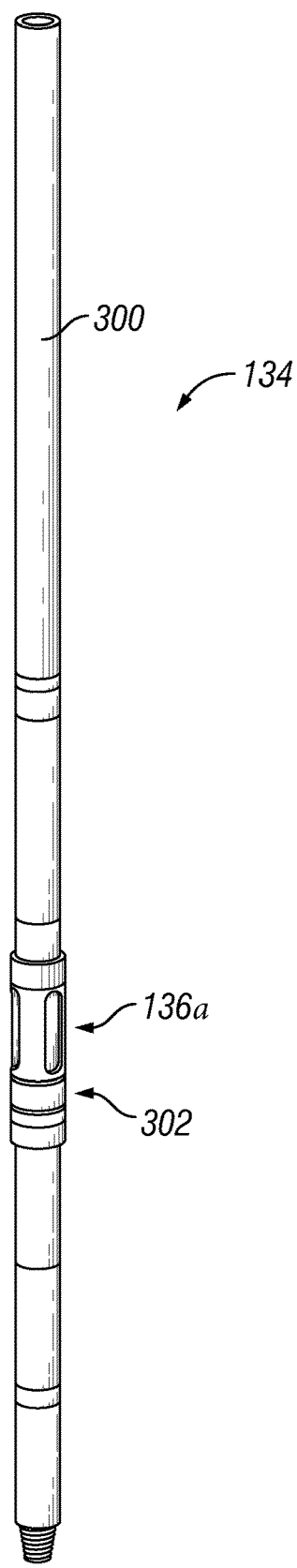
FIG. 3 illustrates an example of a measurement assembly.

FIG. 3 illustrates a close-up view of an example of measurement assembly 134. As illustrated, measurement assembly 134 may include at least one battery section 300 and at least one instrument section 302. Battery section 300 may operate and function to enclose and/or protect at least one battery that may be disposed in battery section 300. Without limitation, battery section 300 may also operate and function to power measurement assembly 134. Specifically, battery section 300 may power at least one transducer 136a, which may be disposed at any end of battery section 300 in instrument section 302.

Instrument section 302 may house at least one transducer 136a. Transducers may function and operate to generate and record excitations within a borehole. For example, during operations, transducer 136a may transmit an excitation into wellbore 102 (e.g., referring to FIG. 1). Without limitation, the excitation may be in the form of a pressure pulse, current, electromagnetic field, radio frequency, and/or any other suitable medium. This may allow for transducer 136a to be an ultrasonic device, acoustic device, electromagnetic device, radio frequency device, and/or the like. In examples, may be made of piezo-ceramic crystals, or optionally magnetostrictive materials or other materials that generate an acoustic pulse when activated electrically or otherwise. In one or more examples, transducers 136a may also include backing materials and matching layers. Additionally, transducer 136a may include coils, antennas, and/or the like. It should be noted that transducers 136a and/or instrument section 302 may be removable and replaceable, for example, in the event of damage or failure.

During operations, in examples where transducer 136*a* may emit a pressure wave, specifically an ultrasonic pressure pulse wave, the pressure pulse may have a frequency range from about 10 kHz to about 500 kHz, with a center of about 250 kHz. It should be noted that the pulse signal may be emitted with different frequency content. Recordings and/or measurements taken by transducer 136*a* may be transmitted to information handling system 138 by any suitable means, as discussed above. Transmission may be performed in real-time (transmitted to the surface via mud-pulse, wired-pipe or other telemetry) or post-drill (from data stored in the tool memory and recovered at the surface during tripping).

In examples, transducers 136*a* may further sense and record the transmission of the excitation. The excitation may travel from transducer 136*a* and reflect off a borehole wall. The reflected excitation is defined as an echo, which is recorded by transducer 136*a*. Without limitation, transducers 136*a* may measure the excitation as it travels from transducer 136*a* and is reflected back to transducer 136*a* as an echo.

Measurements may be used to form images of the surrounding borehole and/or subterranean formation. To generate these images, measurement assembly 134 may utilize one or more transducers 136*a* positioned at varying azimuths around the circumference of measurement assembly 134. In examples, each transducer 136*a* may operate and function independently emitting an excitation and detecting its reflection from the borehole wall as a reflected echo.

The amplitude of the received echo at each transducer 136*a* may be stacked into composite spatial bins or pixels (typically of 1- or 2-degree width and ¼ inch (0.6 cm) height) at each depth. Stacking may be defined as taking the mean, or median, or harmonic mean, or trimmed-mean (where the larger and smaller outliers are discarded) of the values of all the reflection amplitude measurements falling into each pixel. This list of definitions of the term stacking should not be taken to be exhaustive and those skilled in the art could easily derive alternative means of averaging. However, irrespective of the stacking method used the resulting image may be a sum of contributions from two or more transducers.

Figure 4:
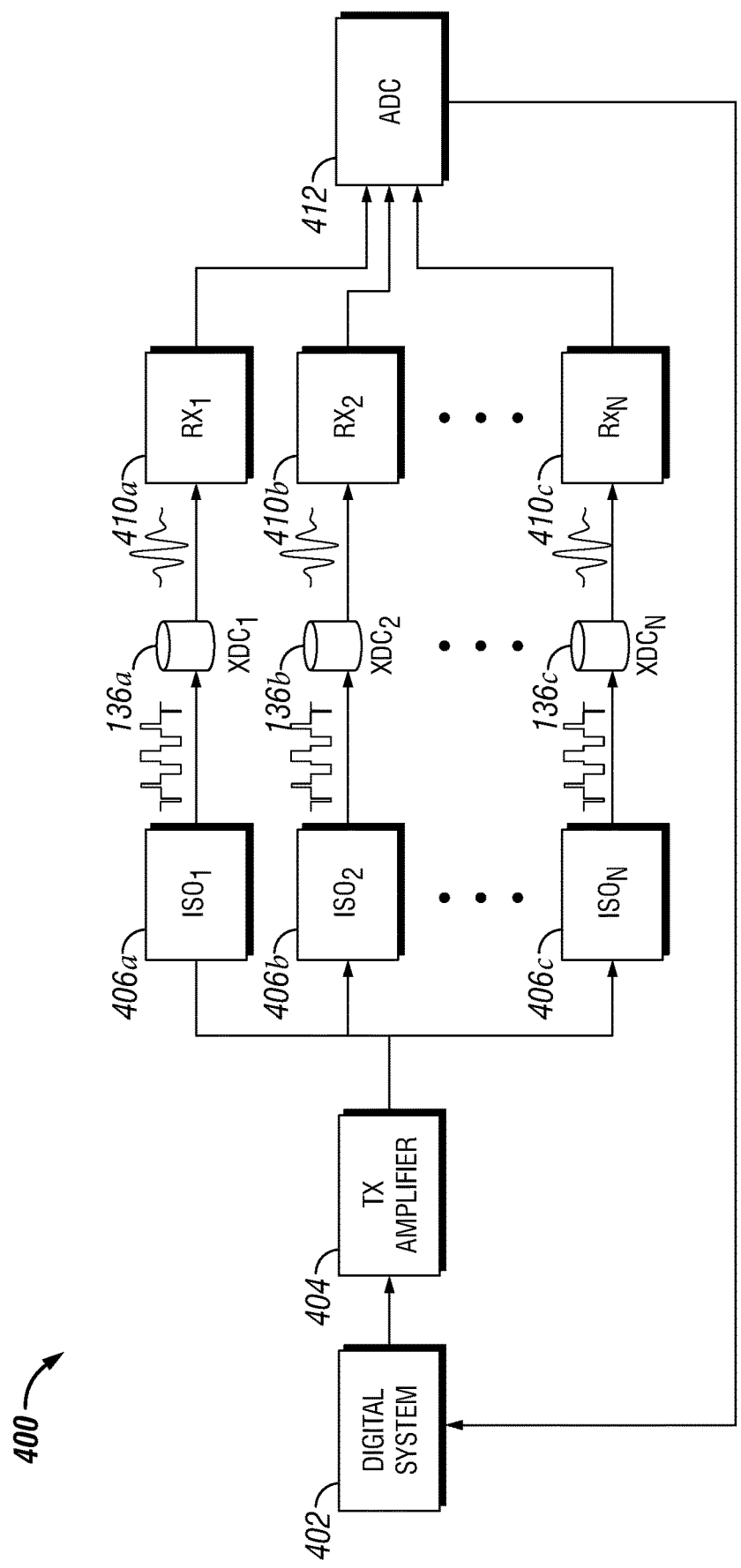
FIG. 4 illustrates an example of a device schematic.

FIG. 4 illustrates an example of device schematic 400 disposed within measuring assembly 134 (e.g., referring to FIG. 3). As illustrated in FIG. 4, measuring assembly 134 may comprise a digital control system 402, a transmitter amplifier 404, isolation modules identified as 406*a-c* (ISO1~n), transducers identified as 136*a-c* (XDC1~n), receivers 410*a-c* (RX1~n) and an analog digital controller (ADC) module 412. It should be noted that isolation modules 406*a-c* may be identified collectively as isolation modules 406*a-c* or individually as first isolation module 406*a*, second isolation module 406*b*, and third isolation module 406*c*. Likewise, transducers 136*a-c* may be identified collectively as transducers 136*a-c* and individually as first transducer 136*a*, second transducer 136*b*, and third transducer 136*c*, and receivers 410*a-c* may be identified collectively as receivers 410*a-c* and individually as first receiver 410*a*, second receiver 410*b*, and third receiver 410*c*. It should be noted that each of transducers 136*a-c* may be referred to as a "pinger" and/or transceiver. During operations, digital control system 402 may operate and/or function to control transmitter amplifier 404. For example, digital control system 402 may activate transmitter amplifier 404 to emit an excitation. Transmitter amplifier 404 may operate and/or function to transmit a high voltage signals for a fixed time interval to at least one of the isolation modules 406*a-c*, simultaneously. It should be noted that "high voltage" is defined as 100 volts or greater. During the transmission of the high voltage signals, the high voltage may pass through at least one of the isolation modules 406*a-c*. Without limitation, there may be at least one of the isolation modules 406*a-c* for each transmitter amplifier 404. In examples, each of the isolation modules 406*a-c* may pass the high voltage excitation to one of the directly connected transducers 136*a-c* and one of the directly connected receivers 410*a-c*. For example, first isolation module 406*a* may pass the high voltage excitation directly to the first transducer 136*a* and the first receiver 410*a*.

Figure 5:
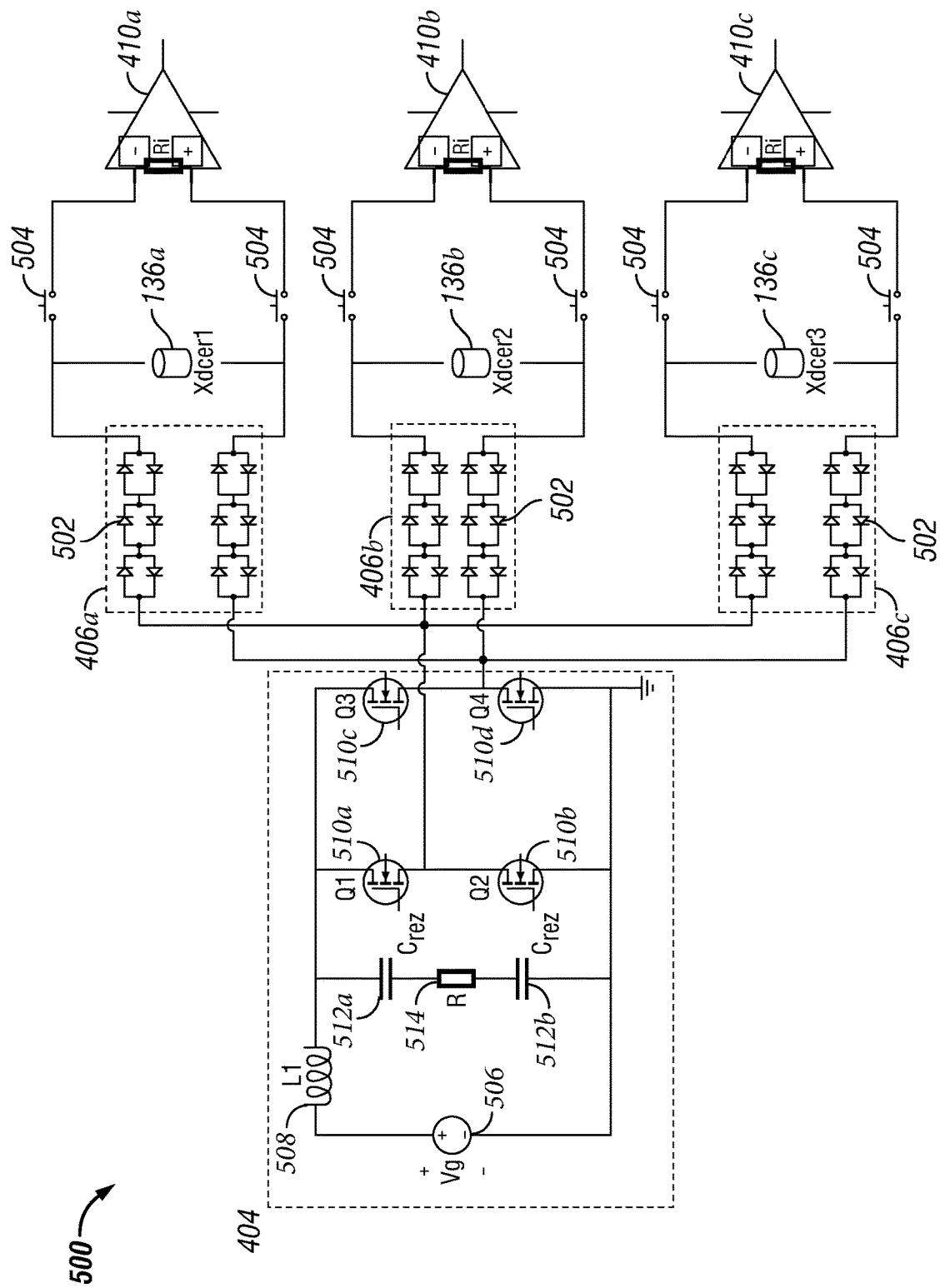
FIG. 5 illustrates an example of a circuit diagram.

Transducers 136*a-c* may exert (e.g., broadcast, produce, and/or transmit) an excitation into wellbore 102 (e.g., referring to FIG. 1). An excitation may be a pressure pulse, an electromagnetic field, a magnetic field, a radio wave, acoustic wave, ultrasonic wave, and/or the like. Without limitation, transducers 136*a-c* may be an ultrasonic transducer, an EM transceiver coil, or an NMR antenna. It should be noted that an application with different transducers 136*a-c* or transceivers (must be able to both transmit and receive) may utilize this circuitry topology, such as the downhole electromagnetic tool with electromagnetic sensors. The signal does not have to be differential as shown in FIG. 5. A single-ended signal may operate and function with this circuit topology. In an example of downhole operations, the excitation may be emitted from each of transducers 136*a-c* as a pressure pulse. The pressure pulse may reflect off a wall of wellbore 102. It should be noted that the pressure pulse may be reflected off the wall of wellbore 102 in the form of an echo. The echo may be sensed, measured, and/or recorded by each of transducers 136*a-c*. The received signal (e.g., echo), usually low voltage (millivolts), may be isolated from flowing back to transmitter amplifier 404 or any other receiver channels. For example, each of receivers 410*a-c* may capture the response (i.e., received signal) from each of transducers 136*a-c*. The received signal may be amplified by each of receivers 410*a-c* and transmitted to ADC 412. ADC 412 may digitize the received signal then send the digitized signal to digital control system 402 for storage, processing, and/or further transmission to an off-site location. From the digitized signal, digital control system 402 may alter operations and control of transmitter amplifier 404. Therefore, each channel (i.e., first transducer 136*a*, second transducer 136*b*, third transducer 136*c*) may share a common source of the high voltage driving signal but may remain independent in terms of receiving a signal (i.e., echo) without interfering with each other.

FIG. 5 is an example of a circuit diagram 500 disposed in measuring assembly 134 (e.g., referring got FIG. 1). Additionally, circuit diagram 500 illustrates the physical setup for device schematic 400 (i.e., referring to FIG. 4). As illustrated in FIG. 5, transmitter amplifier 404 generates the high voltage signal from a voltage source 506. The voltage may traverse through an inductor 508 to stabilize the signal. Inductor 508 may be connected to MOSFETs 510*a-d*, capacitors 512*a, b*, and resistor 514, which are connected in parallel, transmitter amplifier 404 may be either linear or switching types. The high voltage signal generated from transmitter amplifier 404 may traverse through isolation modules 406*a-c*. Each of the isolation modules 406*a-c* may comprise at least one diode 502, discussed below. Traversing through isolation modules 406*a-c*, the high voltage signal may activate and drive transducers 136*a-c* to produce and emit an excitation, such as a pressure pulse, into wellbore 102 (i.e., referring to FIG. 2). Simultaneously, the high voltage signal may be blocked by at least one switch 504 from traversing to a particular one of the receivers 410a-c. A switch 504 may be associated with each of the receivers 410a-c.

Switch 504 may engage during reflecting receiving time (e.g., recording an echo or reflected excitation) where switch 504 may allow a low voltage signal through and block the high voltage pulse signal from damaging the associated one of the receivers 410a-c. Switch 504 may prevent the pulse signal from entering and causing damage to the associated one of the receivers 410a-c. It should be noted that switch 504 may be controlled by the digital control system 402 (i.e., referring to FIG. 4). This may allow switch 504 to be active or passive. For example, if switch 504 is active, then it may be directly controlled by another device such as digital control system 402. If the switch 504 is passive, then switch 504 may act autonomously by opening and/or closing based at least in part on the presence of a high voltage signal. After emitting the ultrasonic pressure pulse, the ultrasonic pressure pulse may reflect off a wall of wellbore 402 as an echo. The echo may be sensed, measured, and/or recorded by transducers 136a-c (e.g., referring to FIG. 1). The received signal may be a low voltage signal. A low voltage signal may pass through switch 504, which may still be engaged, to the associated one of the receivers 410a-c. One of the isolation modules 406a-c may prevent the received low voltage signal from flowing back to transmitter amplifier 404 and may also prevent each receiver channel (e.g., each receiver channel may be each individual one of receivers 410a-c) from interfering with each other. Receivers 410a-c may be amplifiers followed by analog-to-digital converters (not illustrated) which may transmit digital signals to digital control system 402 (i.e., referring to FIG. 4).

Each of the isolation module 406a-c, discussed above, may be a series of diodes 502 that may be disposed in chains. Additionally, diodes 502 may be paired with other diodes 502 and diode chains may be paired with other diode chains. For example, the number of diode pairs in each chain may be pre-determined by a perceived voltage of the received signal. If the received signal may be large in amplitude, more diodes pairs may be needed to block the received signal from flowing back. For example, if the received signal has peak amplitude around 1 volt, and each back to back diode pair has 0.7V forward voltage drop, one or more of the isolation modules 406a-c may include at least 2 pairs of diodes (0.7V×2) to block the received signal from passing through. Additionally, the total forward voltage drop of diodes 502 in the chains may need to be considered and for the excitation pulse transmitted from transmitter amplifier 404.

Figure 6:
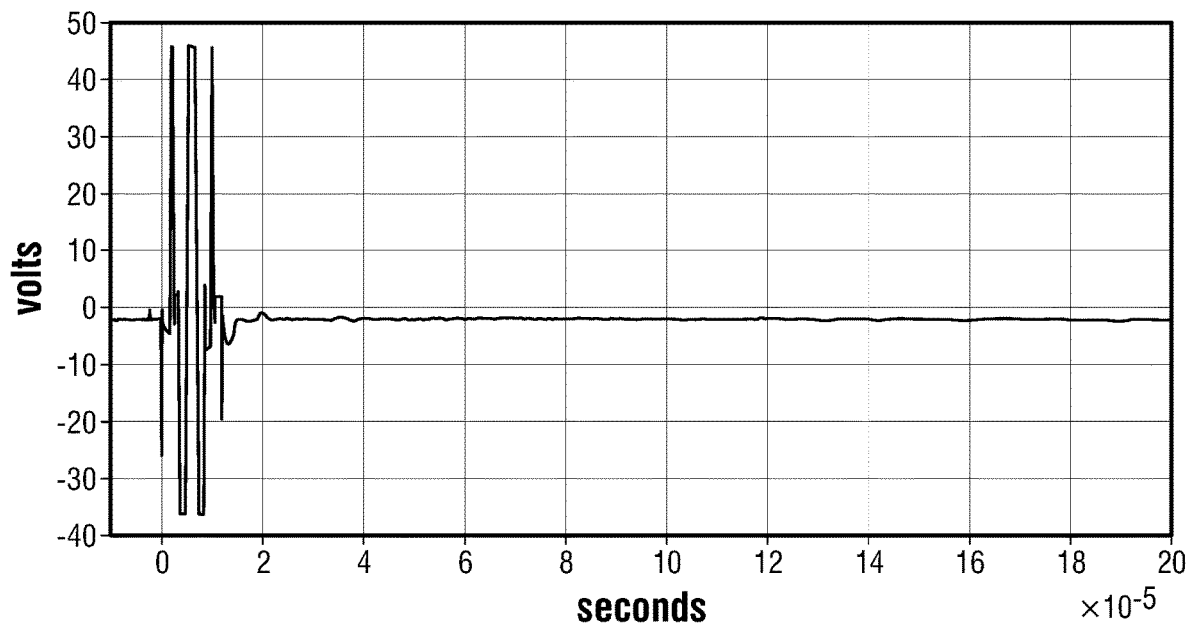
FIG. 6 is a graph of a firing signal generated by a transmitter amplifier.
Figure 7:
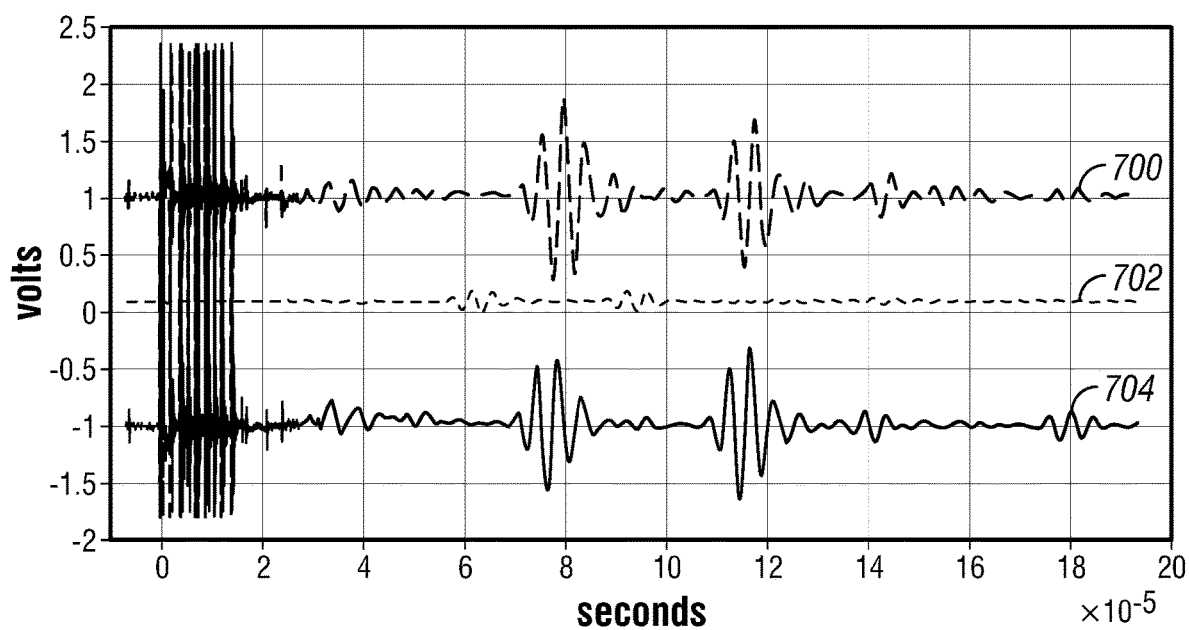
FIG. 7 is a graph of three transducer recording individual echoes.

FIGS. 6 and 7 are example graphs of simulated data demonstrating the operation of the circuitry set-up for measuring assembly 134 (e.g., referring to FIG. 3). As seen in the graph of FIG. 6 an 80V peak to peak firing signal generated by transmitter amplifier 404 (e.g., referring to FIG. 4) is shown. The firing signal generated and shown in FIG. 6 may be utilized across multiple receivers, for example 410a-c. This may be possible due to the peak to peak firing signal that is generated across the firing signal. FIG. 7 shows the result from three receivers 410a-c (e.g., a three channels transceiver system). In this example, each of transducers 136a-c (i.e., referring to FIG. 4) may be set-up with different targets, which may allow each transducer 136a-c to have a distinct response. In FIG. 7, a response from each channel is captured and plotted as a first channel 700, a second channel 702, and a third channel 704. It may be seen that the excitation signal from transmitter amplifier 404 (e.g., referring to FIG. 4) are transmitted and/or recorded at the same time on all channels (e.g., receivers 410a-c), and each channel received reflection has the same feature (frequency) from the excitation signal. But there is no crosstalk between different receiver channels and each channel has different arrival time, amplitude, and/or phase.

It will be appreciated by those of ordinary skill in the art, exemplary examples of the system and individual devices of the present disclosure may be used in a variety of subterranean applications, including imaging. Exemplary examples of the system and devices may be introduced into a subterranean formation and utilized to image a borehole and the surrounding formation. While the preceding discussion is directed to the use of downhole imaging, those of ordinary skill in the art will also appreciate that it may be desirable to utilize other types of imaging in the marine field and medical field, in accordance with examples of the present disclosure.

While methods disclosed above may be used for devices and systems related to oil field devices, the methods are not limited to the oil field. Without limitation, the methods, systems, devices, their function and operation may be utilized in the medical and/or marine fields.

Statement 1: A system may comprise a transmitter amplifier, a first isolation module, where the transmitter amplifier is connected to the first isolation module, a first transducer, wherein the first isolation module is connected to the first transducer, a first receiver, wherein the first isolation module and the first transducer are connected to the first receiver, a second isolation module, where the transmitter amplifier is connected to the second isolation module, a second transducer, wherein the second isolation module is connected to the second transducer, and a second receiver, wherein the second isolation module and the second transducer are connected to the second receiver.

Statement 2. The system of statement 1, wherein the transmitter amplifier is configured to transmit an excitation signal.

Statement 3. The system of statement 2, wherein the excitation signal transverses from the transmitter amplifier to the first transducer through the first isolation module and to the second transducer through the second isolation module.

Statement 4. The system of statement 3, wherein the first transducer and the second transducer are configured to emit a pressure pulse.

Statement 5. The system of statement 1 or 2, wherein the first isolation module and the second isolation module each individually comprise at least one diode.

Statement 6. The system of statement 5, wherein the at least one diode is paired with a second diode.

Statement 7. The system of statement 1, 2, or 5, wherein the system further comprises at least one switch disposed between the first transducer and the first isolation module, and between the first transducer and the first receiver.

Statement 8. The system of statement 7, wherein the system further comprises another switch disposed between the second transducer and the second isolation module, and between the second transducer and the second receiver.

Statement 9. The system of statement 8, wherein the at least one switch prevents a high voltage from entering the first receiver and the second receiver.

Statement 10. The system of statement 1, 2, 5, or 7, wherein a digital control system is configured to control the transmitter amplifier.

Statement 11. A downhole tool may comprise a digital control system, a transmitter amplifier, wherein the transmitter amplifier is controlled by the digital control system and configured to transmit an excitation signal, a first isolation module, where the transmitter amplifier is connected to the first isolation module, wherein the excitation signal traverses from the transmitter amplifier to the first isolation module, a first transducer, wherein the first isolation module is connected to the first transducer, wherein the first transducer is configured to emit a pressure pulse, a first receiver, wherein the first isolation module and the first transducer are connected to the first receiver, a second isolation module, where the transmitter amplifier is connected to the second isolation module wherein the excitation signal traverses from the transmitter amplifier to the second isolation module, a second transducer, wherein the second isolation module is connected to the second transducer, wherein the second transducer is configured to emit the pressure pulse, a second receiver, wherein the second isolation module and the second transducer are connected to the second receiver, and an analog to digital converter connected to the first receiver and the second receiver.

Statement 12. The downhole tool of statement 11, wherein the pressure pulse has a frequency range of about 10 kHz to about 500 kHz.

Statement 13. The downhole tool of statements 11-12, wherein the first isolation module and the second isolation module comprise at least one chain of diodes.

Statement 14. The downhole tool of statements 11-13, further comprising at least one switch configured to block high voltage and allow low voltage to pass, disposed between the first transducer and the first isolation module, and the first receiver.

Statement 15. The downhole tool of statement 14, further comprising another switch configured to block high voltage and allow low voltage to pass, disposed between the second transducer and the second isolation module, and the second receiver.

Statement 16. A method may comprise disposing a downhole tool into a wellbore, wherein the downhole tool comprise a digital control system, a transmitter amplifier, wherein the transmitter amplifier is controlled by the digital control system and configured to transmit an excitation signal, a first isolation module, where the transmitter amplifier is connected to the first isolation module, wherein the excitation signal traverses from the transmitter amplifier to the first isolation module, a first transducer, wherein the first isolation module is connected to the first transducer, wherein the first transducer is configured to emit a pressure pulse, a first receiver, wherein the first isolation module and the first transducer are connected to the first receiver, a second isolation module, where the transmitter amplifier is connected to the second isolation module wherein the excitation signal traverses from the transmitter amplifier to the second isolation module, a second transducer, wherein the second isolation module is connected to the second transducer, wherein the second transducer is configured to emit the pressure pulse, a second receiver, wherein the second isolation module and the second transducer are connected to the second receiver, and an analog to digital converter. The method may further comprise transmitting an excitation signal from the transmitter amplifier to the first transducer and the second transducer through the first isolation module and second isolation module, creating a pressure pulse from the first transducer and the second transducer, wherein the pressure pulse reflects off a wall of a wellbore as an echo, sensing the echo with the first transducer and the second transducer, converting the echo into a received signal at the first transducer and the second transducer, and transmitting the received signal to the first receiver and the second receiver.

Statement 17. The method of statement 16, further comprising sending the received signal from the first receiver and the second receiver to the analog to digital converter.

Statement 18. The method of statement 17, further comprising digitizing the received signal to a digital signal at the analog to digital converter.

Statement 19. The method of statement 18, further comprising sending the digital signal from the analog to digital converter to a digital control system.

Statement 20. The method of statement 16 and 17, wherein the first transducer and second transducer are ultrasonic transducers.

It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A system comprising:
   a transmitter amplifier;
   a first isolation module, where the transmitter amplifier is connected to the first isolation module;
   a first transducer, wherein the first isolation module is connected to the first transducer;
   a first receiver, wherein the first isolation module and the first transducer are connected to the first receiver;
   a second isolation module, where the transmitter amplifier is connected to the second isolation module;
   a second transducer, wherein the second isolation module is connected to the second transducer; and
   a second receiver, wherein the second isolation module and the second transducer are connected to the second receiver.

2. The system of claim 1, wherein the transmitter amplifier is configured to transmit an excitation signal.

3. The system of claim 2, wherein the excitation signal transverses from the transmitter amplifier to the first transducer through the first isolation module and to the second transducer through the second isolation module.

4. The system of claim 3, wherein the first transducer and the second transducer are configured to emit a pressure pulse.

5. The system of claim 1, wherein the first isolation module and the second isolation module each individually comprise at least one diode.

6. The system of claim 5, wherein the at least one diode is paired with a second diode.

7. The system of claim 1, wherein the system further comprises at least one switch disposed between the first transducer and the first isolation module, and between the first transducer and the first receiver.

8. The system of claim 7, wherein the system further comprises another switch disposed between the second transducer and the second isolation module, and between the second transducer and the second receiver.

9. The system of claim 8, wherein the at least one switch prevents a high voltage from entering the first receiver and the second receiver.

10. The system of claim 1, wherein a digital control system is configured to control the transmitter amplifier.

11. A downhole tool comprising:
    a digital control system;
    a transmitter amplifier, wherein the transmitter amplifier is controlled by the digital control system and configured to transmit an excitation signal;
    a first isolation module, where the transmitter amplifier is connected to the first isolation module, wherein the excitation signal traverses from the transmitter amplifier to the first isolation module;
    a first transducer, wherein the first isolation module is connected to the first transducer, wherein the first transducer is configured to emit a pressure pulse;
    a first receiver, wherein the first isolation module and the first transducer are connected to the first receiver;
    a second isolation module, where the transmitter amplifier is connected to the second isolation module wherein the excitation signal traverses from the transmitter amplifier to the second isolation module;
    a second transducer, wherein the second isolation module is connected to the second transducer, wherein the second transducer is configured to emit the pressure pulse;
    a second receiver, wherein the second isolation module and the second transducer are connected to the second receiver; and
    an analog to digital converter connected to the first receiver and the second receiver.

12. The downhole tool of claim 11, wherein the pressure pulse has a frequency range of about 10 kHz to about 500 kHz.

13. The downhole tool of claim 11, wherein the first isolation module and the second isolation module comprise at least one chain of diodes.

14. The downhole tool of claim 11, further comprising at least one switch configured to block high voltage and allow low voltage to pass, disposed between the first transducer and the first isolation module, and the first receiver.

15. The downhole tool of claim 14, further comprising another switch configured to block high voltage and allow low voltage to pass, disposed between the second transducer and the second isolation module, and the second receiver.

16. A method comprising:
    disposing a downhole tool into a wellbore, wherein the downhole tool comprises:
      a digital control system;
      a transmitter amplifier, wherein the transmitter amplifier is controlled by the digital control system and configured to transmit an excitation signal;
      a first isolation module, where the transmitter amplifier is connected to the first isolation module, wherein the excitation signal traverses from the transmitter amplifier to the first isolation module;
      a first transducer, wherein the first isolation module is connected to the first transducer, wherein the first transducer is configured to emit a pressure pulse;
      a first receiver, wherein the first isolation module and the first transducer are connected to the first receiver;
      a second isolation module, where the transmitter amplifier is connected to the second isolation module wherein the excitation signal traverses from the transmitter amplifier to the second isolation module;
      a second transducer, wherein the second isolation module is connected to the second transducer, wherein the second transducer is configured to emit the pressure pulse;
      a second receiver, wherein the second isolation module and the second transducer are connected to the second receiver; and
      an analog to digital converter;
    transmitting an excitation signal from the transmitter amplifier to the first transducer and the second transducer through the first isolation module and second isolation module;
    creating a pressure pulse from the first transducer and the second transducer, wherein the pressure pulse reflects off a wall of a wellbore as an echo;
    sensing the echo with the first transducer and the second transducer;
    converting the echo into a received signal at the first transducer and the second transducer; and
    transmitting the received signal to the first receiver and the second receiver.

17. The method of claim 16, further comprising sending the received signal from the first receiver and the second receiver to the analog to digital converter.

18. The method of claim 17, further comprising digitizing the received signal to a digital signal at the analog to digital converter.

19. The method of claim 18, further comprising sending the digital signal from the analog to digital converter to a digital control system.

20. The method of claim 16, wherein the first transducer and second transducer are ultrasonic transducers.

\* \* \* \* \*